US010707862B2

(12) United States Patent
Song et al.

(10) Patent No.: US 10,707,862 B2
(45) Date of Patent: Jul. 7, 2020

(54) POWER-ON RESET CIRCUIT AND UNDER-VOLTAGE LOCKOUT CIRCUIT COMPRISING THE SAME

(71) Applicant: SEMICONDUCTOR COMPONENTS INDUSTRIES, LLC, Phoenix, AZ (US)

(72) Inventors: Kinam Song, Seoul (KR); Wonhi Oh, Bucheon-si (KR); Jinkyu Choi, Bucheon-si (KR); BumSeung Jin, Bucheon-si (KR); Samuell Shin, Guri-si (KR)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/057,589

(22) Filed: Aug. 7, 2018

(65) Prior Publication Data
US 2018/0351545 A1 Dec. 6, 2018

Related U.S. Application Data

(62) Division of application No. 15/204,138, filed on Jul. 7, 2016, now Pat. No. 10,069,491.

(60) Provisional application No. 62/189,299, filed on Jul. 7, 2015.

(51) Int. Cl.
*G06F 1/24* (2006.01)
*H03K 17/22* (2006.01)
*G06F 1/30* (2006.01)

(52) U.S. Cl.
CPC ............. *H03K 17/223* (2013.01); *G06F 1/24* (2013.01); *G06F 1/30* (2013.01); *H03K 2217/0036* (2013.01); *H03K 2217/0063* (2013.01)

(58) Field of Classification Search
CPC .. G06F 1/24; G06F 1/30; H03K 17/22; H03K 17/223
USPC .......................................... 327/142, 143, 198
See application file for complete search history.

(56) References Cited

U.S. PATENT DOCUMENTS

| 4,717,840 | A |   | 1/1988  | Ouyang et al. |              |
|-----------|---|---|---------|---------------|--------------|
| 5,146,107 | A | * | 9/1992  | Matsuoka      | H03K 3/2865  |
|           |   |   |         |               | 327/398      |
| 5,485,111 | A |   | 1/1996  | Tanimoto      |              |
| 5,519,346 | A |   | 5/1996  | Haddad et al. |              |
| 6,388,302 | B1| * | 5/2002  | Galli         | G05F 3/265   |
|           |   |   |         |               | 257/497      |
| 6,683,481 | B1|   | 1/2004  | Zhou et al.   |              |
| 6,686,783 | B1|   | 2/2004  | Huang         |              |
| 7,391,665 | B1|   | 6/2008  | Muang et al.  |              |
| 7,482,847 | B2| * | 1/2009  | Suzuki        | H03K 17/223  |
|           |   |   |         |               | 327/143      |
| 8,547,144 | B2|   | 10/2013 | Lee et al.    |              |

(Continued)

*Primary Examiner* — William Hernandez
(74) *Attorney, Agent, or Firm* — AMPACC Law Group, PLLC

(57) ABSTRACT

An UVLO circuit according to an aspect of the present invention includes: a power-on reset (POR) circuit generating an output based on a first current that flows according to an increase of a power supply voltage and not operating in a normal state of the power supply voltage; and a logic operation unit generating a reset signal according to an output of the POR circuit and an output based on a result of comparison between a sense voltage that corresponds to the power supply voltage and a predetermined reference voltage.

19 Claims, 11 Drawing Sheets

(56) References Cited

U.S. PATENT DOCUMENTS

| | | | |
|---|---|---|---|
| 9,882,558 B1* | 1/2018 | Sun | H03K 17/223 |
| 2007/0001721 A1 | 1/2007 | Chen et al. | |
| 2013/0076410 A1* | 3/2013 | Chen | G06F 1/24 |
| | | | 327/143 |

* cited by examiner

POWER-ON RESET CIRCUIT AND UNDER-VOLTAGE LOCKOUT CIRCUIT COMPRISING THE SAME

CROSS-REFERENCE TO RELATED APPLICATION

This application claims priority to and the benefit of US Provisional Patent Application No. 62/189,299 filed in the USPTO on Jul. 7, 2015, and U.S. patent application Ser. No. 15/204,138 filed on Jul. 7, 2016, the entire contents of which are incorporated herein by reference.

BACKGROUND

(a) Technical Field

Exemplary embodiments of the present invention relate to a power-on reset circuit and an under-voltage lockout circuit including the same.

(b) Description of the Related Art

When a power supply voltage reaches a reference voltage, power-on reset is required for resetting an output a sequential logic circuit. In general, a power-on reset (POR) circuit is weak to fluctuation of a power supply, and power consumption may occur due to a high static current.

For example, the POR circuit may erroneously operate due to a noise in the power supply and thus a sequential logic circuit such as a latch or a flipflop may be reset in a normal state.

Further, as the power supply is increased, a static current of the POR circuit is increased, thereby increasing power consumption.

SUMMARY

The present invention has been made in an effort to provide a POR circuit that can prevent erroneous operation and reduce power consumption, and a under voltage lockout (UVLO) circuit including the same.

A POR circuit according one aspect of the present invention includes: a capacitor in which a first current flows according to an increase of a power supply voltage; a current mirror mirroring the first current to a second current; and a transistor being operated by the second transistor, wherein when the power supply voltage reaches a normal reference voltage, the POR circuit blocks mirroring of the current mirror and turns off the transistor.

The current mirror may include a first current mirror that mirrors the first current to a third mirror and a second current mirror that mirrors the third current to the second current.

The first current mirror may include: a first transistor including a source coupled to the power supply voltage, a drain, and a gate, the drain and the gate being diode-connected; and a second transistor including a gate coupled to the gate of the first transistor, a source coupled to the power supply voltage, and a drain coupled to the second current mirror, and the capacitor is coupled to the drain of the first transistor.

The second current mirror may include: a third transistor including a drain coupled to the drain of the second transistor and a gate coupled to the drain thereof; and a fourth transistor including a gate coupled to the gate of the third transistor and a drain coupled to a gate of the transistor.

The POR circuit may include: a resistor coupled between the power supply voltage and the capacitor; and a first transistor including a gate coupled to a node where the resistor and the capacitor are coupled and a source coupled to the power supply voltage, wherein the current mirror is coupled to a drain of the first transistor.

The current mirror may include: a second transistor including a drain coupled to the drain of the first transistor and a gate coupled to the drain thereof; and a third transistor including a gate coupled to the gate of the second transistor and a drain coupled to a gate of the transistor.

The POR circuit may further include: a first transistor being turned on by a first voltage and blocking mirroring of the first current; and a second transistor being turned on by a second voltage and turning off the transistor.

The current mirror may include two transistors mirroring a third current that corresponds to the first current to the second current, and the first transistor may be coupled between gates of the two transistors and a predetermined voltage and the first voltage may be input to a gate of the first transistor.

The second transistor may include a gate to which the second voltage is input, a first terminal coupled to the power supply voltage, and a second terminal coupled to a gate of the transistor.

An under-voltage lockout (UVLO) circuit according to another aspect of the present invention may include: a power-on reset (POR) circuit generating an output based on a first current that flows according to an increase of a power supply voltage and not operating in a normal state of the power supply voltage; and a logic operation unit generating a reset signal according to an output of the POR circuit and an output based on a result of comparison between a sense voltage that corresponds to the power supply voltage and a predetermined reference voltage.

The POR circuit may include: a capacitor charged by the first current; a current mirror that mirrors the first current to a second current; and a transistor being operated by the second current.

The current mirror may include: a first current mirror that mirrors the first current to a third current; and a second current mirror that mirrors the third current to the second current.

The first current mirror may include: a first transistor including a source coupled to the power supply voltage, a drain, and a gate, the drain and the gate being diode-connected; and a second transistor including a gate coupled to the gate of the first transistor, a source coupled to the power supply voltage, and a drain coupled to the second current mirror, wherein the capacitor is coupled to the drain of the first transistor.

The second current mirror may include: a third transistor including a drain coupled to the drain of the second transistor and a gate coupled to the drain thereof; and a fourth transistor including a gate coupled to the gate of the third transistor and a drain coupled to a gate of the transistor.

The POR circuit may include: a resistor coupled between the power supply voltage and the capacitor; and a first transistor including a gate coupled to a node where the resistor and the capacitor are coupled and a source coupled to the power supply voltage, wherein the current mirror is coupled to a drain of the first transistor.

The current mirror may include: a second transistor including a drain coupled to the drain of the first transistor and a gate coupled to the drain thereof; and a third transistor including a gate coupled to the gate of the second transistor and a drain coupled to a gate of the transistor.

The POR circuit may include: a first transistor being turned on according to a predetermined first voltage and blocking mirroring of the first current; and a second transistor being turned on according to a predetermined second voltage and turning off the transistor.

The current mirror may include two transistors mirroring a third current that corresponds to the first current to the second current. The first transistor may be coupled between gates of the two transistors and a predetermined voltage, and the first voltage may be input to a gate of the first transistor.

The second transistor may include a gate to which the second voltage is input, a first terminal coupled to the power supply voltage, and a second terminal coupled to a gate of the transistor.

The first voltage may be a voltage compared with a sense voltage that corresponds to the power supply voltage for determination of a normal state of the power supply voltage, and the second voltage may be the sense voltage.

According to the exemplary embodiments of the present invention, a POR circuit that can prevent erroneous operation and reduce power consumption, and a UVLO circuit including the same can be provided.

DETAILED DESCRIPTION OF THE EMBODIMENTS

Figure 1:
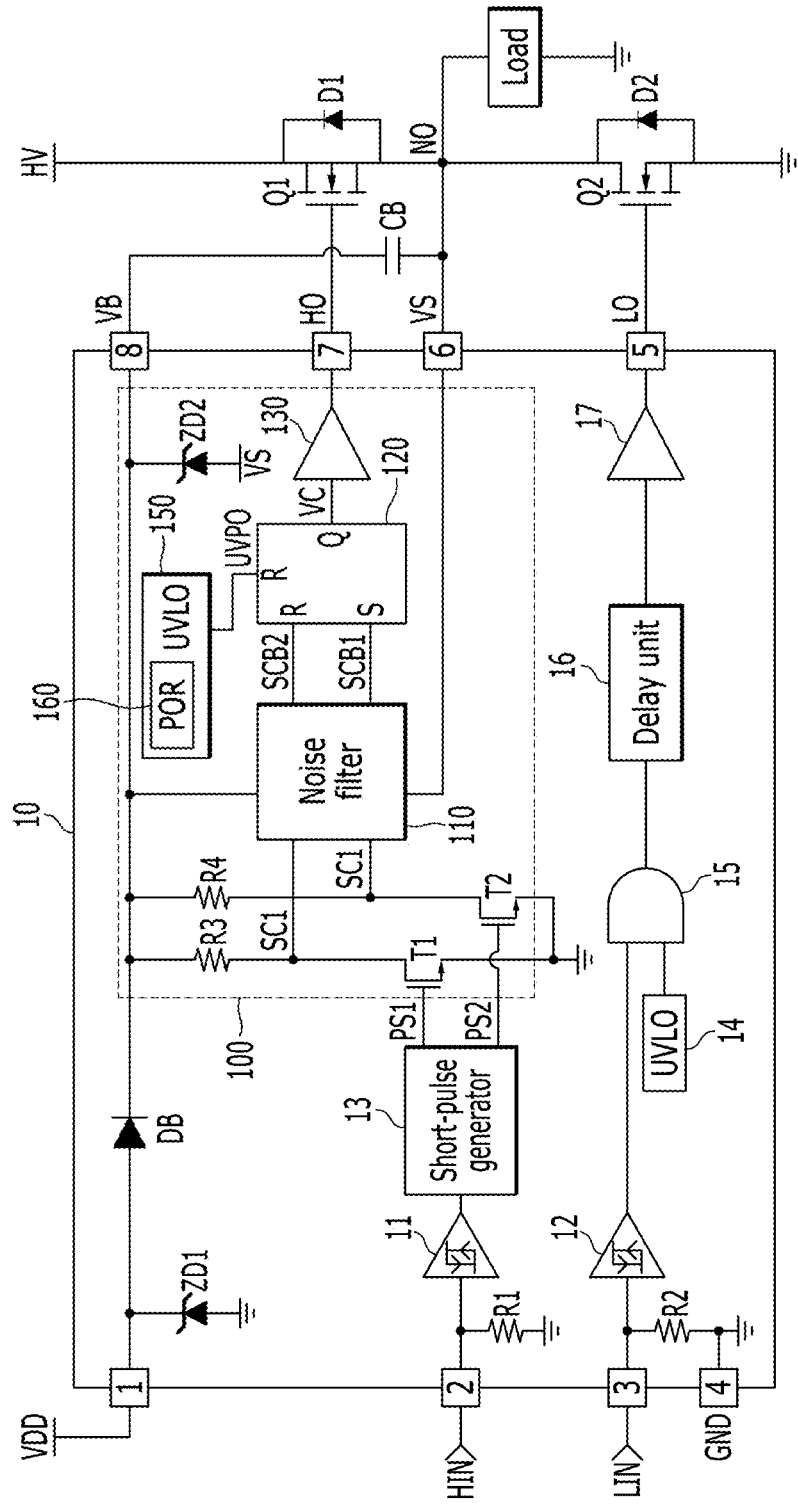
FIG. 1 shows a UVLO circuit including a POR circuit and a switch driving circuit including the UVLO circuit according to an exemplary embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising", will be understood to imply the inclusion of stated elements but not the exclusion of any other elements.

FIG. 1 shows a UVLO circuit including a POR circuit and a switch driving circuit including the UVLO circuit according to an exemplary embodiment of the present invention.

A high-side switch Q1 and a low-side switch Q2 shown in FIG. 1 are implemented using a metal oxide semiconductor field effect transistor (MOSFET), a bipolar junction transistor (BJT), or an insulated gate bipolar transistor (IGBT), and include body diodes D1 and D2.

A voltage HV is supplied to a drain of the switch Q1, a source of the switch Q1 and a drain of the switch Q2 are connected to an output node NO, and a source of the switch Q2 is connected to a ground. Power is supplied to a load connected to the output node NO by switching operation of the switch Q1 and switch Q2. A gate of the switch Q1 is connected to a connection pin 7, and a gate signal HO is supplied to the gate of the switch Q1. A gate of the switch Q2 is connected to a connection pin 5, and a gate signal LO is supplied to the gate of the switch Q2.

The switches Q1 and Q2 according to the exemplary embodiment of the present invention are implemented as an n-channel type MOSFET, BJT, or IGBT element. Thus, when the gate signals HO and LO are high level, the switches Q1 and Q2 are turned on, and when the signals HO and LO are low, the switches Q1 and Q2 are turned off. A node where a source electrode of the switch Q1 and a drain electrode of the switch Q2 meet becomes an output terminal.

The switch driving circuit 10 receives a power supply voltage Vdd through a connection pin 1, and is connected to a ground GND through a connection pin 4. The switch driving circuit 10 receives a switching control signal HIN for controlling the switching operation of the switch Q1 through a connection pin P2, and receives a switching control signal LIN for controlling the switching operation of the switch Q2 through a connection pin P3.

A connection pin 6 of the switch driving circuit 10 is connected to the output node NO, and a bootstrap capacitor CB is connected between the connection pin 8 and the connection pin 6. A bootstrap diode DB is connected between a connection pin 1 and the connection pin 8, a zener diode ZD1 is connected between the connection pin 1 and a ground, and a zener diode ZD2 is connected between the connection pin 8 and the connection pin 6. Each of the zener diode ZD1 and the zener diode ZD2 may clamp a voltage between lateral ends to a zener voltage.

A resistor R1 is connected between the connection pin 2 and a ground, and a comparator 11 determines an output depending on a voltage level of the switching control signal HIN input through the connection pin 2. A resistor R2 is connected between the connection pin 3 and a ground, and the comparator 12 determines an output depending on a voltage level of the switching control signal LIN input through the connection pin 3. The comparator 11 and the comparator 12 have a hysteresis characteristic.

A short-pulse generator 13 generates a short-pulse according to the output of the comparator 11. For example, the short-pulse generator 13 generates a short-pulse signal PS1 by being synchronized at a time that the output of the comparator 11 is increased to high level from low level, and generates a short-pulse signal PS2 by being synchronized at a time that the output of the comparator 11 is decreased to low level from high level.

The gate driver 100 generates the gate signal HO according to the short-pulse signals PS1 and PS2. The gate driver 100 includes two resistors R3 and R4, two transistors T1 and T2, a noise filter 110, an SRR-flipflop 120, a driver 130, a UVLO (under-voltage lockout) circuit 150, and a POR circuit 160.

The two resistors R3 and R4 and the two transistors T1 and T2 form a level shifter. The two transistors T1 and T2 respectively perform switching operations according to the corresponding short-pulse signals PS1 and PS2. According to the switching operations of the two transistors T1 and T2, driving signals SC1 and SC2 are generated. The driving signal SC1 becomes low level when the transistor T1 is turned on, and becomes a predetermined high level when the transistor T1 is turned off. The driving signal SC2 becomes low level when the transistor T2 is turned on, and becomes a predetermined high level when the transistor T2 is turned off.

The noise filter 110 filters a noise of the driving signals SC1 and SC2 and transmits noise-filtered driving signals to a reset terminal R and a set terminal S of the SRR-flipflop 120. For example, the noise filter 110 may be implemented as an inverter that inverts phases of the driving signals SC1 and SC2. The driving signal SC1 is inverted through the noise filter 110 and thus becomes a driving signal SCB1, and the driving signal SC2 is inverted through the noise filter 110 and thus becomes a driving signal SCB2.

The SRR-flipflop 120 includes two reset terminals R to which an output signal of the UVLO circuit 150 and the driving signal SCB2 are input, a set terminal R to which the driving signal SCB1 is input, and an output terminal Q to which an output signal VC generated according to inputs of the reset terminal R and the set terminal S is output. The SRR-flipflop 120 increases the output signal VC to high level by being synchronized at a rising edge input to the set terminal S, and decreases the output signal VS to low level by being synchronized at a rising edge input to the reset terminal R.

The UVLO circuit 150 outputs high level for a period during which the power supply voltage VB is increased to a normal reference voltage, and outputs low level when the power supply voltage VB reaches the normal reference voltage. A normal state begins after the power supply voltage VB reaches the normal reference voltage. In order to reduce an influence of a noise of the power supply voltage VB, a predetermined filtering time may be set in the UVLO circuit 150.

However, the power supply voltage VB may be rapidly increased and thus reach a reference voltage before a lapse of the filtering time. In this case, the SRR-flipflop 120 needs to be reset when the power supply voltage VB starts to increase. However, since an initial value of a sequential logic circuit such as a latch or a flipflop is not known, an output of the sequential logic circuit should be reset to the initial value for normal operation of the gate driver 100.

In order to solve the above-stated problem, the POR circuit 160 according to the exemplary embodiment of the present invention generates an output for POR operation when the power supply voltage VB starts to increase. Then, the SRR-flipflip 120 may be reset by an output of the UVLO circuit 150 even before the filtering time is passed.

Further, the POR circuit 160 may not operate after the normal state. The POR circuit 160 then starts to operate only for an initial operation period during which the power supply voltage VB increases, and accordingly, erroneous operation that may occur due to pulsating noise of the power supply voltage VB in the normal state can be prevented.

In the structure shown in FIG. 1, the UVLO circuit 150 includes the POR circuit 160, but the present invention is not limited thereto. The two circuits may be combined using various methods.

The driver 130 generates the gate signal HO according to the output of the SRR-flipflop 120.

In order to control the switching operation of the switch Q2, the switch driving circuit 10 may be provided with an AND gate 15 that determines an output thereof depending on an output of the comparator 12, a delay unit 16 delaying the output of the AND gate 15 for a predetermined time period, and a gate driver 17. The switch driving circuit 10 may also be provided with an UVLO circuit 14 that senses whether a power supply voltage supplied to the gate driver 17 is a low voltage.

Hereinafter, a configuration of the UVLO circuit and the POR circuit according to the exemplary embodiment of the present invention will be described with reference to FIG. 2 and FIG. 3.

Figure 2:
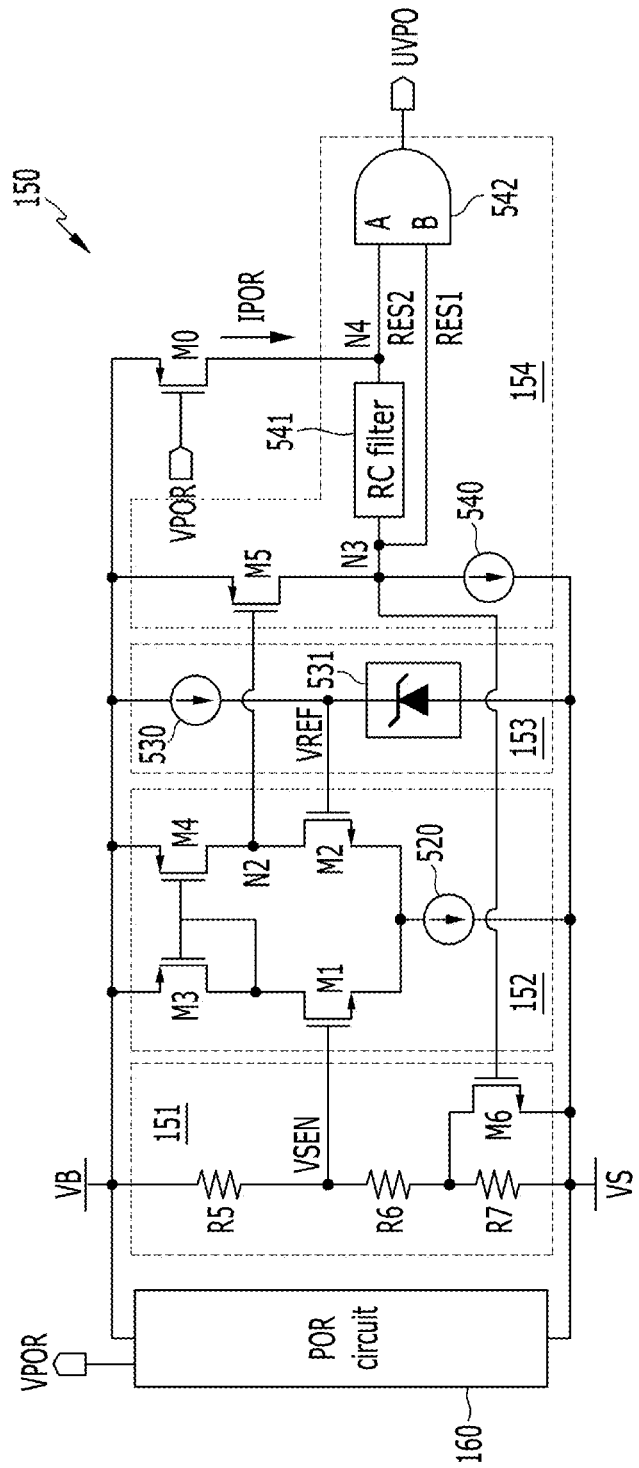
FIG. 2 shows a UVLO circuit according to the exemplary embodiment of the present invention.

FIG. 2 shows the UVLO circuit according to the exemplary embodiment of the present invention.

Figure 3:
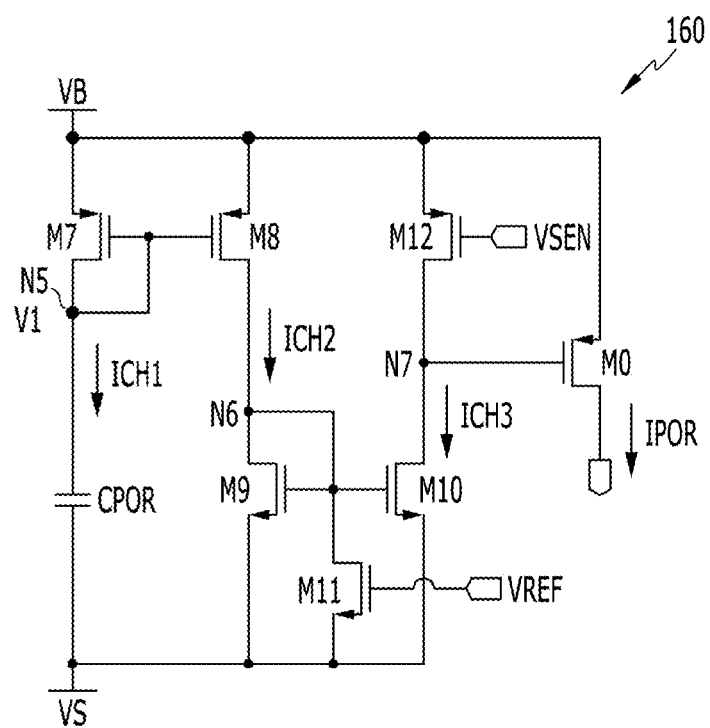
FIG. 3 shows a POR circuit according to the exemplary embodiment of the present invention.

FIG. 3 shows the POR circuit according to the exemplary embodiment of the present invention.

As shown in FIG. 2, the UVLO circuit 150 includes a voltage detector 151, a comparator 152, a reference voltage generator 153, and an output terminal 154.

The voltage detector 151 generates a sense voltage VSEN that senses the power supply voltage VB. The voltage detector 151 includes three resistors R5 to R7 that are connected in series between the power supply voltage VB and a voltage VS of the output node NO and a transistor M6.

A voltage of a node N1 where the resistor R5 and the resistor R6 are connected is the sense voltage VSEN. In order to assign the hysteresis characteristic to the comparator 152, the transistor M6 is connected in parallel to the resistor R7. The sense voltage VSEN in the turn-on state of the transistor M6 is VB*R6/(R5+R6), and the sense voltage VB in the turn-off state of the transistor M6 is VB*(R6+R7)/(R5+R6+R7).

The reference voltage generator 153 includes a current source 530 supplying a current based on the power supply voltage VB and a zener diode 531, and generates a reference voltage VREF using the current source 530 and the zener diode 531.

The current source 530 and the zener diode 531 are connected in series between the power supply voltage VB and a ground, and the zener diode 531 is biased by the current of the current source 530. The current source 530 generates a current using the power supply voltage VB. While the power supply voltage VB is being increased, the reference voltage VREF may be increased according to the increase of the power supply voltage VB. In the normal state, the reference voltage VREF may be maintained with a zener voltage of the zener diode 531.

The comparator 152 determines a level of a first reset signal RES1 according to a result of comparison between the sense voltage VSEN and the reference voltage VREF.

The comparator 152 includes four transistors M1 to M4 and a current source 520.

The power supply voltage VB is supplied to each source of the transistor M3 and the transistor M4, a gate of the transistor M3 and a gate of the transistor M4 are connected to each other, a drain of the transistor M3 is connected to a drain of the transistor M1, a drain of the transistor M4 is connected to a drain of the transistor M2, and the gate and the drain of the transistor M3 are connected to each other. The transistor M3 and the transistor M4 form a current mirror circuit.

The sense voltage VSEN is input to a gate of the transistor M1, the reference voltage VREF is input to a gate of the transistor M2, a source of the transistor M1 and a source of the transistor M2 are connected to each other, and the current source 520 synchronizes a current to the output node NO from the source of the transistor M1 and the source of the transistor M2.

A current flowing to the transistor M1 is controlled by the sense voltage VSEN, and is mirrored by the transistor M3 and the transistor M4. A current flowing to the transistor M2 is controlled by the reference voltage VREF, a current that corresponds to a difference between the mirrored current and the current flowing to the transistor M2 is supplied to the gate of the transistor M5 or synchronized therefrom.

When the sense voltage VSEN is higher than the reference voltage VREF in a condition that a mirror ratio is 1:1 and the transistor M1 and the transistor M2 have the same characteristic, a current flows to the gate of the transistor M5 and thus the gate voltage of the transistor M5 is increased, and the transistor M5 is turned off so that the first reset signal RES1 becomes low level. On the contrary, when the sense voltage VSEN is lower than the reference voltage VREF, a current flows from the gate of the transistor M5 such that the gate voltage of the transistor M5 is decreased, and the transistor M5 is turned on and thus the first reset signal RES1 becomes high level.

The output terminal 154 generates a UVLO reset signal UVPO depending on an output of the POR circuit 160 and an output of the comparator 152. The output terminal 154 includes the transistor M5, the current source 540, a RC filter 541, and an AND gate 542.

A source of the transistor M5 is connected to the power supply voltage VB, a gate of the transistor M5 is connected to a node N2, and a drain of the transistor M5 is connected to a node N3. The current source 540 is connected between the node N3 and the output node NO and thus is capable of controlling a voltage of the first reset signal RES1.

When the transistor M5 is in the turn-off state, a voltage of the node N3 is decreased by the current of the current source 540 such that the first reset signal RES1 becomes low level. When the transistor M5 is in the turn-on state, the voltage of the node N3 depends on the power supply voltage VB and the first reset signal RES1 becomes high level.

The RC filter 541 may output a second reset signal RES2 by delaying the first reset signal RES1 for a predetermined filtering time.

The AND gate 542 generates a UVLO reset signal UVPO by performing an AND operation on the first reset signal RES1 and the second reset signal RES2.

The POR circuit 160 may supply a POR current IPOR to a node N4 connected to one A of two input terminals of the AND gate 542. For example, when the power supply voltage VB starts to increase, the POR current IPOR is supplied to the node N4 through a transistor M0. Then, when a voltage of the input end B is high level, a voltage of the input terminal A is increased such that the UVLO reset signal UVPO can be high level.

Hereinafter, the POR circuit 160 will be described with reference to FIG. 3.

The POR circuit 160 generates a current IPOR based on a current that is generated according to a change of the power supply voltage VB. As an example of an output of the POR circuit 160, the output of the POR circuit 160 may be a voltage. The POR circuit 160 includes seven transistors M0 and M7 to M12 and a capacitor CPOR.

The transistor M7 and the transistor M8 form a current mirror, and the transistor M7 and the transistor M8 mirror a current ICH1 supplied to the capacitor CPOR to a current ICH2. The transistor M9 and the transistor M10 form a current mirror, and the transistor M9 and the transistor M10 mirror the current ICH2 to a current ICH3. A transistor M10 is connected between the power supply voltage VB and the input terminal A of the AND gate 542, and the transistor M10 is controlled by the current ICH2.

The transistor M11 is connected to the transistor M9 and between the gate of the transistor M10 and the voltage VS, and is switched by the reference voltage VREF. The transistor M12 is connected between the power supply voltage VB and the gate of the transistor M0, and is switched by the sense voltage VSEN.

When the transistor M11 is turned on, mirroring of the current ICH1 is blocked. The voltage VS is input to gates of the transistors M9 and M10 through the turn-on transistor M11 and thus the transistor M9 and the transistor M10 are turned off. When the transistor M12 is turned on, the power supply voltage VB is input to the gate of the transistor M0 such that the transistor M0 is turned off. That is, when the transistor M11 and the transistor M12 are turned on, the POR circuit 160 does not operate.

The transistor M7 is diode-connected, and a source of the transistor M7 and a source of the transistor M8 are connected to the power supply voltage VB, and a drain of the transistor M7 and one end of the capacitor CPOR are connected to a node N5. A gate of the transistor M8 and a gate of the transistor M7 are connected to each other.

The current ICH1 is generated according to a current ICH1 according to a change of the power supply voltage VB, and a voltage of the capacitor CPOR is changed. For example, the capacitor CPOR is charged by the current ICH1 and thus a voltage V1 of the node N5 is increased for an initial operation period during which the power supply voltage VB is increased. The voltage V1 can be increased to a voltage VB-VTHP, which is acquired by subtracting a threshold voltage VTHP from the power supply voltage VB. In order to increase on-resistance, the length of a channel of the transistor M7 can be extended.

The current ICH1 can be represented as given in Equation 1, and CPOR in Equation 1 denotes capacitance of the capacitor CPOR.

$$ICH1 = CPOR \times \frac{dVB}{dt} \qquad \text{[Equation 1]}$$

The transistor M9 is diode-connected, and a source of the transistor M9 and a source of the transistor M10 are connected to the voltage VS, a drain of the transistor M9 is connected with a drain of the transistor M8 at a node N6, a gate of the transistor M9 and a gate of the transistor M10 are connected to each other, and a drain of the transistor M10 is connected to a node N7.

The reference voltage VREF has a level that turns off the transistor M11 for a period during which the power supply voltage VB is increased. Thus, during this period, the current ICH2 is mirrored to a current ICH3 by the transistor M9 and the transistor M10. The current ICH3 can be represented as given in Equation 2, and in Equation, W7, W8, W9, and W10 respectively denote channel widths of the transistors M7, M8, M9, and M10 and L7, L8, L9, and L10 respectively denote channel lengths of the transistors M7, M8, M9, and M10.

$$ICH3 = ICH1 \times \left(\frac{W8/L8}{W7/L7}\right) \times \left(\frac{W10/L10}{W9/L9}\right) \quad \text{[Equation 2]}$$

When a voltage of the node N7 is decreased to the voltage VS by the current ICH3, the transistor M0 is turned on and the POR current IPOR is supplied to the node N4 such that an input of the input terminal A of the AND gate 542 becomes high level. When the power supply voltage VB starts to increase, the output of the comparator 152 is high level, and therefore the UVLP reset signal UVPO becomes high level according to an input of the input terminal A.

The voltage V1 can be represented as given in Equation 3. In Equation 3, RON7 denotes on-resistance of the transistor M7, CPOR denotes capacitance of the capacitor CPOR, and t denotes time.

$$V1(t) = VB \times \left(1 - e^{\frac{-t}{RON7 \cdot CPOR}}\right) \quad \text{[Equation 3]}$$

Equation 3 can be summarized with respect to time as shown in Equation 4:

$$t = -RON7 \cdot CPOR \cdot \ln\left(1 - \frac{V1(t)}{VB}\right) \quad \text{[Equation 4]}$$

Since RON7 denotes on-resistance of the transistor M7, which can be represented as given in Equation 5, and VDS7 in Equation 5 denotes a drain-source voltage of the transistor M7, VTHP denotes a threshold voltage of the transistor M7, and β denotes a transconductance coefficient of the transistor M7.

$$RON7 = \frac{VDS7}{ICH1} = \frac{VTHP + \sqrt{\frac{2ICH1}{\beta}}}{ICH1} = \frac{VTHP}{ICH1} + \sqrt{\frac{2}{\beta \cdot ICH1}} \quad \text{[Equation 5]}$$

Equation 6 shows a result of substitution of RON7 of Equation 5 to Equation 4, and charging time of the capacitor CPOR can be controlled by adjusting β, which is a characteristic of the transistor M7, and capacitance of the capacitor CPOR.

$$t = -\left(\frac{VTHP}{ICH1} + \sqrt{\frac{2}{\beta \cdot ICH1}}\right) \cdot CPOR \cdot \ln\left(1 - \frac{V1(t)}{VB}\right) \quad \text{[Equation 6]}$$

For example, in order to improve POR operation, charging time of the capacitor CPOR needs to be adjusted. In order to meet such a need, at least one of the characteristic of transistor M7, i.e., β and the capacitor CPOR can be controlled.

A resistor may be used instead of the transistor M7 in the exemplary embodiment of FIG. 3. Then, a voltage charged to the capacitor CPOR can be increased to the power supply voltage VB.

Figure 4:
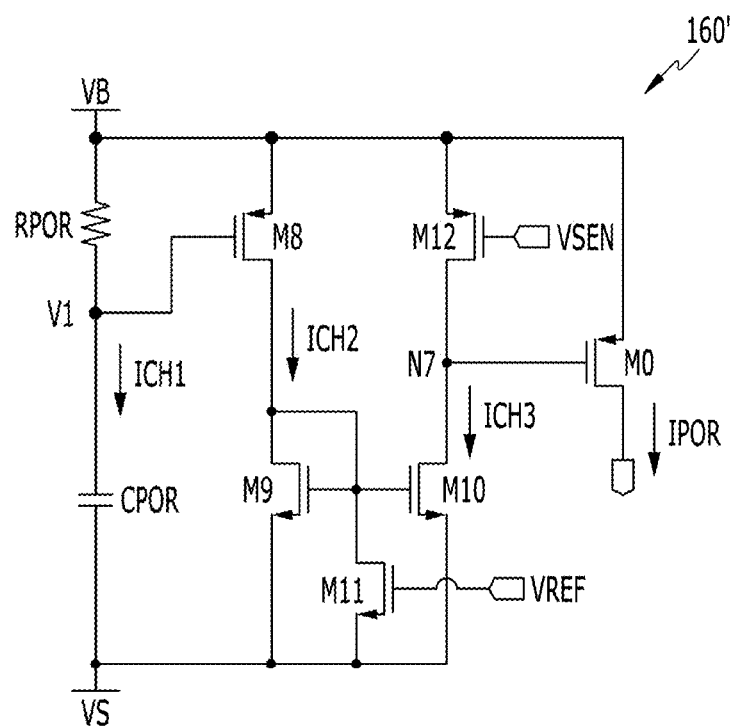
FIG. 4 shows a POR circuit according to another exemplary embodiment of the present invention.

Referring to FIG. 4, another exemplary embodiment of the present invention will be described.

FIG. 4 shows a POR circuit according to another exemplary embodiment of the present invention.

The same constituent elements as that of the previous exemplary embodiment are indicated by the same reference numerals, and the same description is omitted.

As shown in FIG. 4, in a POR circuit 160', a resistor RPOR and a capacitor CPOR are connected in series between a power supply voltage VB and a voltage VS. A current ICH2 flows to a transistor M8 according to a current ICH1 that is generated when the power supply voltage VB is increased. As in the previous exemplary embodiment, the current ICH2 is mirrored to a current ICH3 by a transistor M9 and a transistor M10.

In the present exemplary embodiment, charging time of the capacitor CPOR also can be represented as given in Equation 7. Instead of the on-resistor RON7, a resistor RPOR is applied to Equation 7. RPOR denotes a resistance value of the resistor RPOR and the resistance value may be high.

$$t = -RPOR \cdot CPOR \cdot \ln\left(1 - \frac{V1(t)}{VB}\right) \quad \text{[Equation 7]}$$

The resistance value of the resistor RPOR and capacitance of the capacitor CPOR may be appropriately selected in consideration of a balance between the area of the POR circuit and POR performance.

A high-peak pulsating noise may occur in the power supply voltage VB. For example, in a high-voltage integrated circuit shown in FIG. 1, the high-peak pulsating noise may be supplied to a gate driver of a switch Q1 through the power supply voltage VB. For stable operation of the high voltage integrated circuit, a UVLO signal, which is an output of a ULVO circuit 150, needs to be maintained in low level that corresponds to a normal state.

The POR circuits 160 and 160' according to the exemplary embodiments of the present invention include the transistor M11 and transistor M12, and the transistor M11 and the transistor M12 block operation of the POR circuits 160 and 160' in the normal state. Thus, since the POR circuits 160 and 160' do not operated when the high-peak pulsating noise is applied, immunity of the POR circuits 160 and 160' with respect to noise can be improved. Further, since the POR circuits 160 and 160' do not operate in the normal state, power can be saved.

Figure 5:
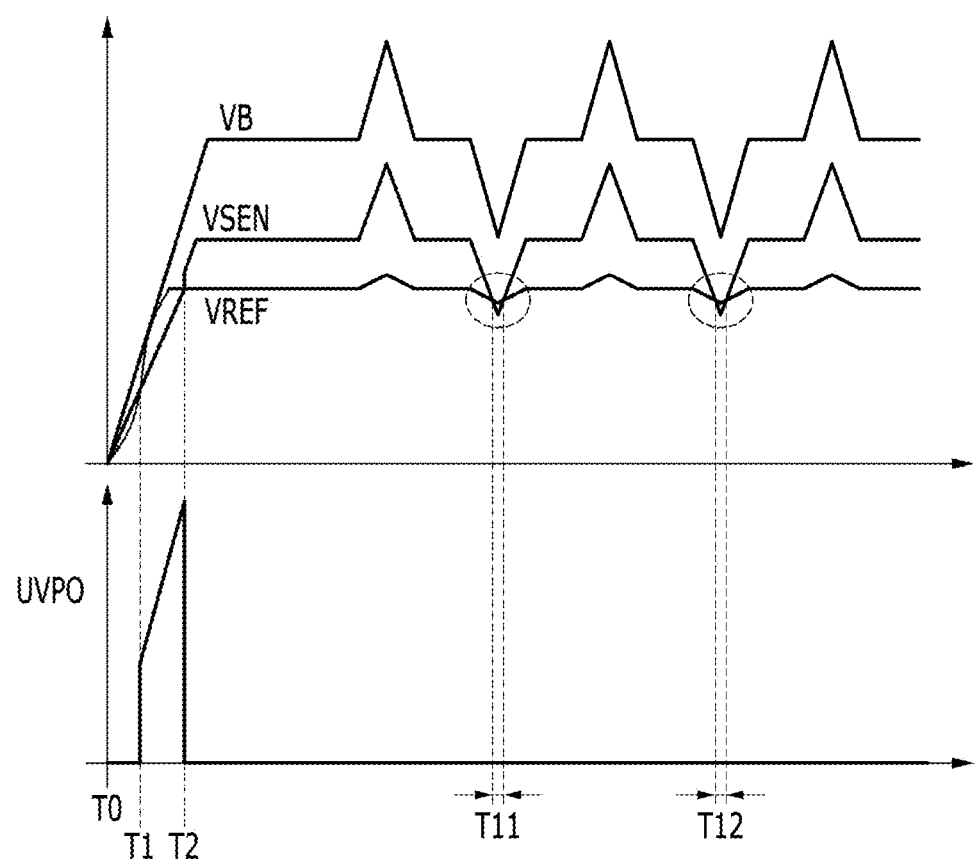
FIG. 5 is a waveform diagram of a power supply voltage, a sense voltage, a reference voltage, and a UVLO reset signal where a high-peak pulsating noise is occurred.

FIG. 5 is a waveform diagram of a power supply voltage, a sense voltage, a reference voltage, and a UVLO reset signal, each experiencing a high-peak pulsating noise.

In FIG. 5, a waveform of the power supply voltage VB is rapidly increased and decreased due to the high-peak pulsating noise, and this is an example provided for description of the prevent invention, and the present invention is not limited thereto. As shown in FIG. 5, the sense voltage VSEN and the reference voltage VREF may be increased and decreased according to a pulsating noise of the power supply voltage VB.

The power supply voltage VB starts to increase from T0, and the input terminal A of the AND gate 542 becomes high level by the current IPOR of the POR circuit (160 or 160'). When the reference voltage VREF becomes higher than the sense voltage VSEN at T1, the input terminal B of the AND gate 542 also becomes high level such that the UVLO reset signal UVPO becomes high level.

When the sense voltage VSEN becomes higher than the reference voltage VREF at T2, the input terminal B of the AND gate 542 becomes low level such that the UVLO reset signal UVPO also decreases to low level.

After T2, the power supply voltage VB becomes a normal state. Although the high-peak pulsating noise occurs in the power supply voltage VB in the normal state, as shown in FIG. 5, the UVLO reset signal UVPO is not generated as a high level signal.

For example, for T11 and T12, i.e., for a period during which the sense voltage VSEN becomes lower than the reference voltage VREF, the input terminal B of the AND gate 542 becomes high level, but the input terminal A maintains low level during a predetermined filtering time. Since the transistors M11 and M12 of the POR circuits 160 and 160' according to the exemplary embodiments are in the turn-on state, the current IPOR is not supplied from the POR circuits 160 and 160'. That is, the input terminal A is not interfered by the POR circuits 160 and 160'. Thus, the UVLO circuit 150 does not become high level and the SRR-flipflop 120 is not reset, and accordingly, the gate signal HO is normally generally.

In the exemplary embodiments of the present invention, the sense voltage VSEN and the reference voltage VREF are respectively applied to the gate of the transistor M12 and the gate of the transistor M11, but the present invention is not limited thereto. A voltage having any level, which can turn on the transistor M11 and the transistor M12 in the normal state, can be applied thereto.

Figure 6:
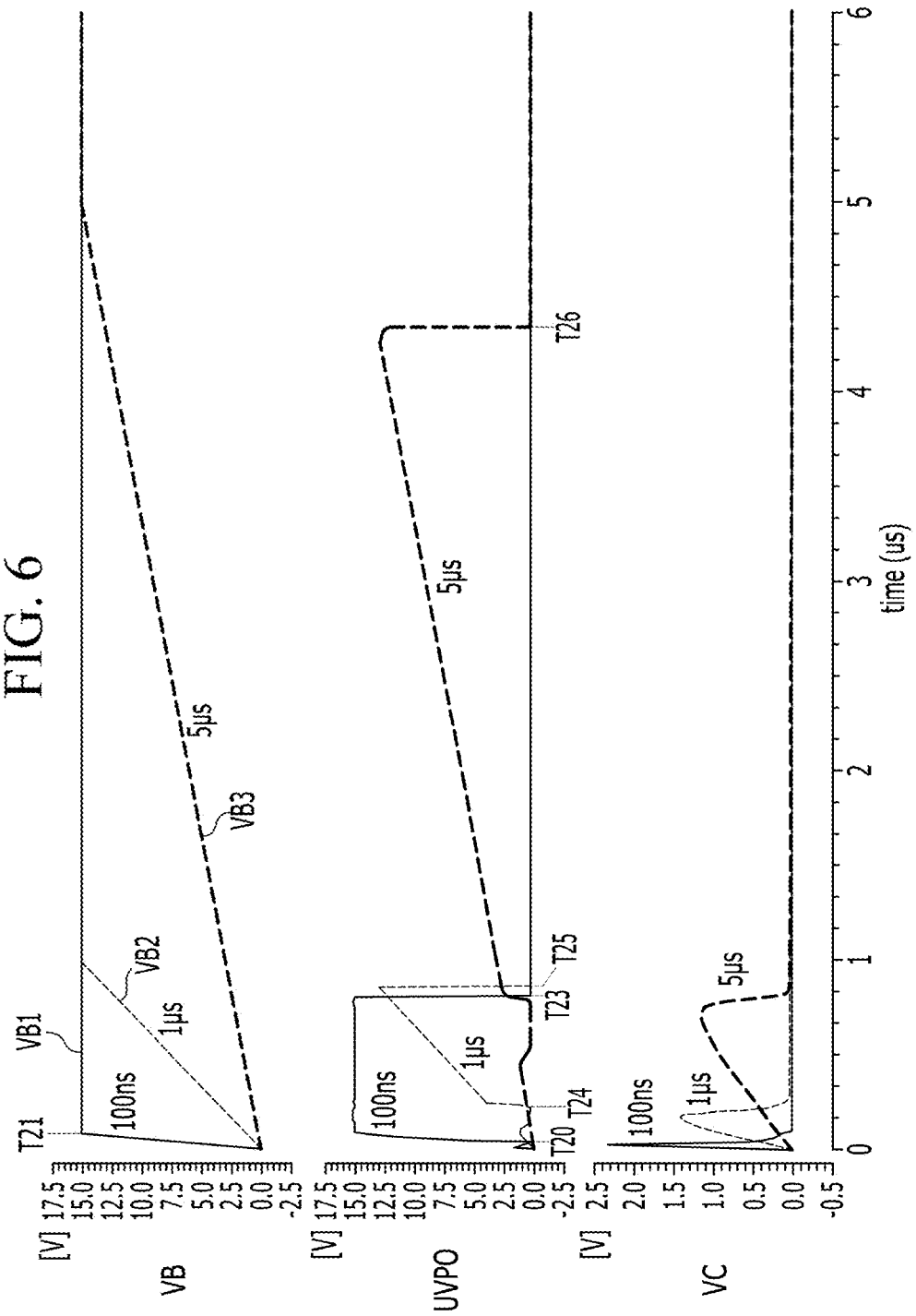
FIG. 6 is a waveform diagram of a power supply voltage, a UVLO reset signal, and an output of an SRR-flipflop.

FIG. 6 is a waveform diagram of outputs of the power supply voltage, the UVLO reset signal, and the SRR-flipflop.

In FIG. 6, three waveforms VB1 to VB3 of periods during which the power supply voltage VB reaches the reference voltage of 15V, which are 100 ns, 1 us, and 5 us are illustrated.

When the power supply voltage VB is increased, the UVLO reset signal UVPO is increased to high level by the output of the POR circuits 160 and 160'.

For example, when the power supply voltage VB is VB1, the UVLO reset signal UVPO is increased to high level at T20, and an output signal VC of the SRR-flipflop 120 is reset to low level directly after T20. Although the power supply voltage VB reaches 15V at T21, the UVLO reset signal UVPO maintains high level for a transmission delay time of the comparator 152 and then decreases to low level at T23.

When the power supply voltage VB is VB2, the UVLO reset signal UVPO is increased to high level at T24, and the output signal VC of the SRR-flipflop 120 is reset to low level directly after T24. The sense voltage VSEN that corresponds to the power supply voltage VB reaches the reference voltage VREF at T25, and thus the UVLO reset signal UVPO can be decreased to low level.

When the power supply voltage VB is VB3, the UVLO reset signal UVPO is increased to high level at about T23, and the output signal VC of the SRR-flipflop 120 is reset to low level directly after T23. The sense voltage VSEN that corresponds to the power supply voltage VB reaches the reference voltage VREF at T26, and the UVLO reset signal UVPO then can be decreased to low level.

As described, when the power supply voltage VB starts to increase, the output signal VC of the SRR-flipflop 120 is reset to low level without regard to an increase slope of the power supply voltage VB.

Figure 7:
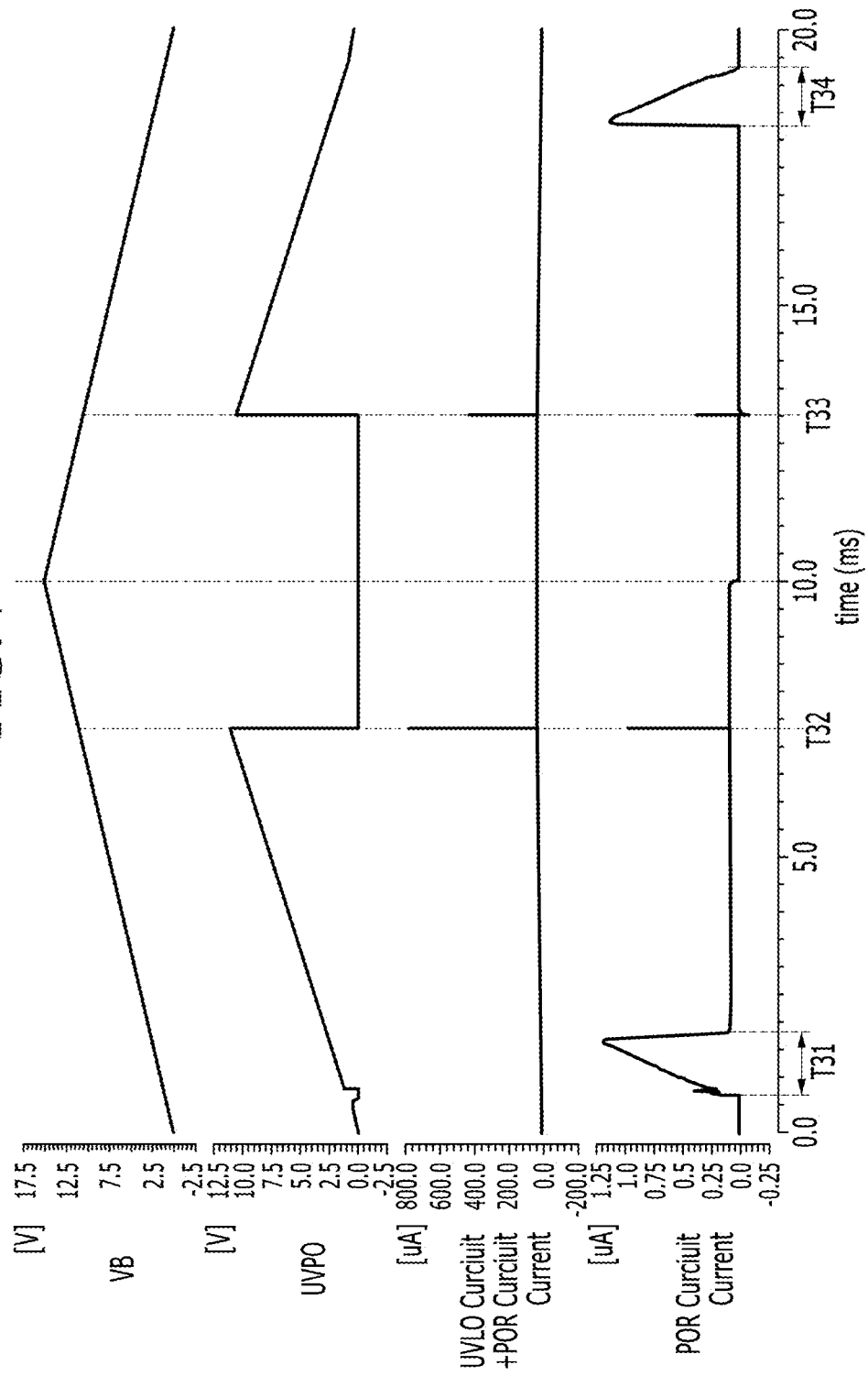
FIG. 7 is a waveform diagram of a power supply voltage, a UVLO reset signal, a current of the UVLO circuit, and a current of the POR circuit.

FIG. 7 is a waveform diagram of the power supply voltage, the UVLO reset signal, a current of the UVLO circuit, and a current of the POR circuit.

In FIG. 7, the power supply voltage VB has a waveform that is increased to the normal reference voltage, i.e., 15V, and then decreased. Such a waveform is provided for description of current consumption of the UVLO circuit and the POR circuit, and the present invention is not limited thereto.

As shown in FIG. 7, when the power supply voltage VB starts to increase, a current flowing to the capacitor CPOR is increased during T31 in the POR circuits 160 and 160'. During T31, the voltage V1 is increased by charging of the capacitor CPOR such that no more current flows after T31.

When the power supply voltage VB is increased and thus the sense voltage VSEN reaches the reference voltage VREF at T32, the UVLO reset signal UVPO is decreased to low level. In this case, a current flows due to transient of a logic output in the UVLO circuit 150 and the POR circuits 160 and 160', and then hardly flows after that.

When the power supply voltage VB is decreased and thus the sense voltage VSEN becomes lower than the reference voltage VREF at T33, the UVLO reset signal UVPO is increased to high level. In this case, a current flows in the UVLO circuit 150 and the POR circuits 160 and 160', and then hardly flows after that.

After the power supply voltage VB starts to decrease, a current may be generated by refresh operation of the capacitor CPOR according to the decrease of the power supply voltage VB during T34.

As described, a current flows in the POR circuits 160 and 160' for a predetermined time period according to a change of the power supply voltage VB, and a current shortly flows at an edge of the UVLO reset signal UVPO. That is, current consumption periods of the POR circuits 160 and 160' are short not only in the normal state but also for a period during which the UVLO reset signal UVPO is generated.

Figure 8A:
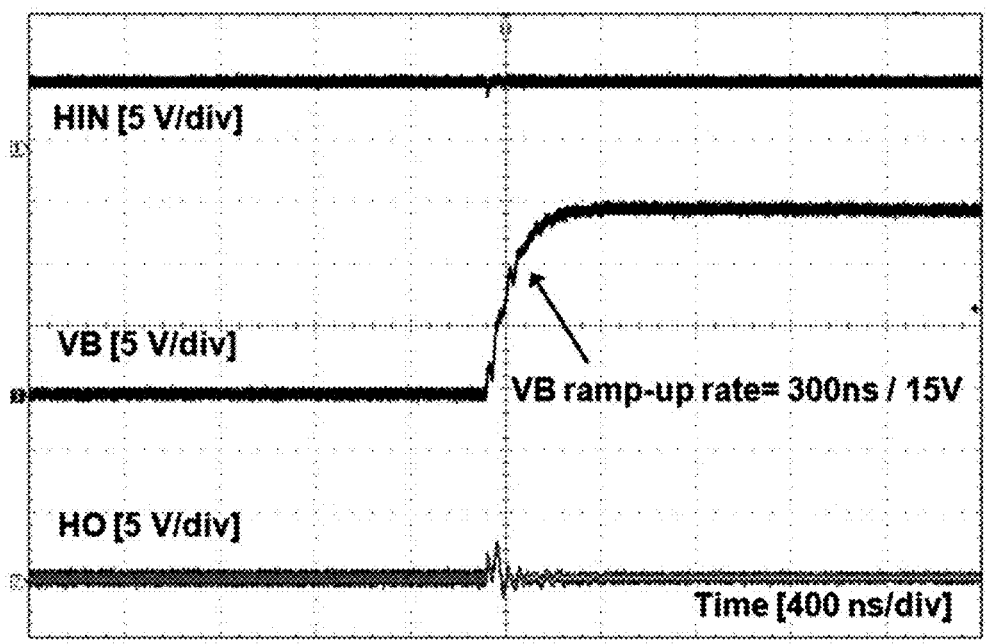
FIG. 8A and FIG. 8B show a switching control signal, a gate signal, and a power supply voltage.
Figure 8B:
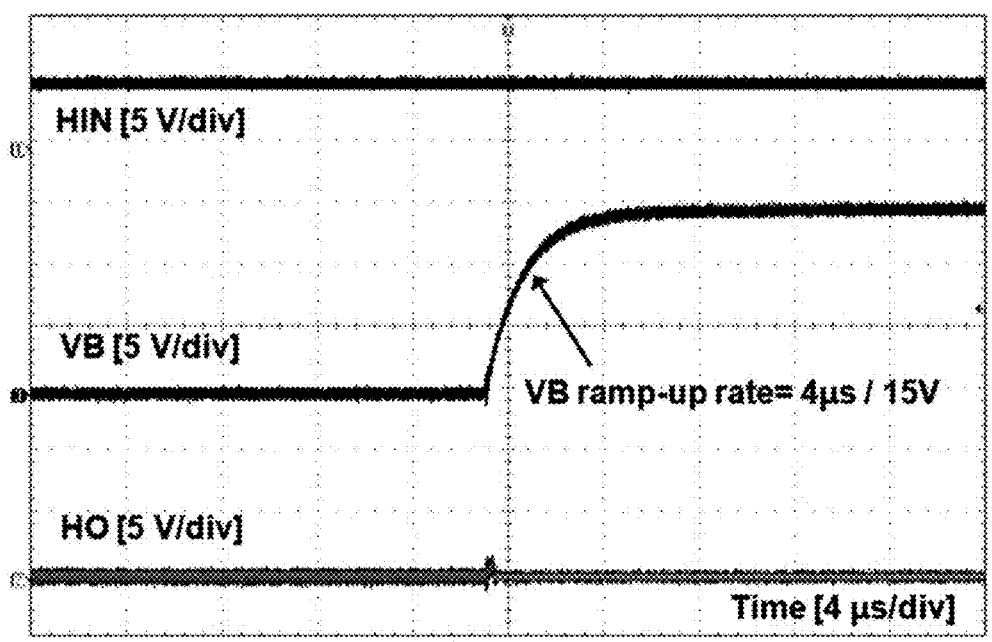

FIG. 8A and FIG. 8B shows the switching control signal, the gate signal, and the power supply voltage.

In FIG. 8A, the power supply voltage VB is increased with an ramp-up rate of 300 ns/15V, and in FIG. 8B, the power supply voltage VB is increased with an ramp-up rate of 4 us/15V. In FIG. 8A and FIG. 8B, the switching control signal HIN is high level.

FIG. 8A and FIG. 8B show waveforms of the switching control signal HIN, the gate signal HO, and the power supply voltage VB in a condition where the power supply voltage VB has been decreased after the output of the SRR-flipflop 120 has been set at a high level and where the output of the SRR-flipflop 120 is unconditionally high level when the power supply voltage VB starts to be increased.

In FIG. 8A and FIG. 8B after the power supply voltage VB starts to be increased, the UVLO reset signal UVPO may be increased to high level according to the output of the POR circuits 160 or 160'. Then, the output of the SRR-flipflop 120 is reset such that the gate signal HO is reset to low level.

As shown in FIG. 8A and FIG. 8B, the POR operation can be performed without regard to the ramp-up rate of the power supply voltage VB.

Figure 9A:
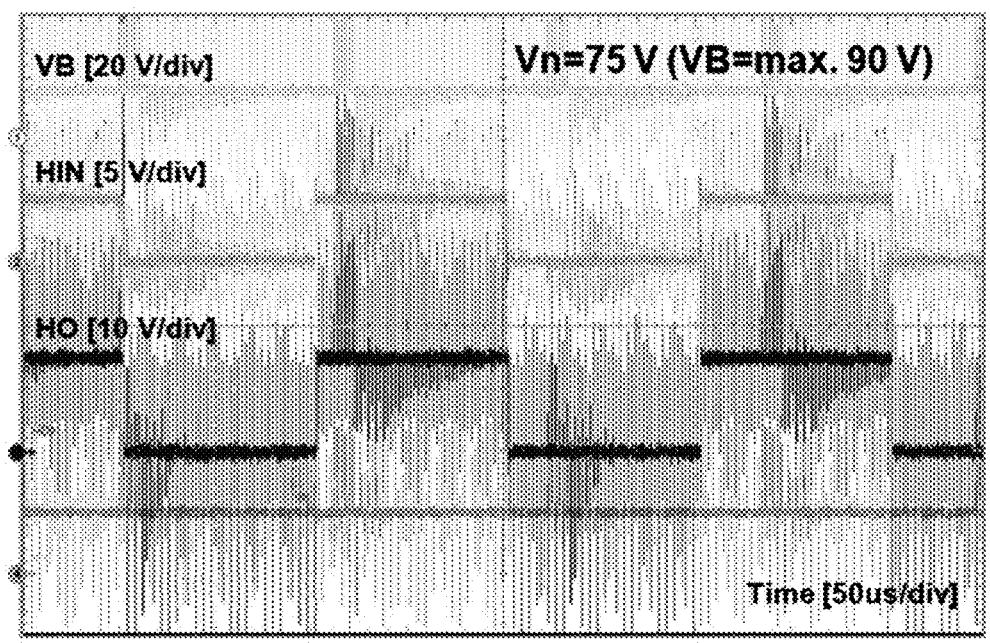
FIG. 9A and FIG. 9B are waveform diagrams of a power supply voltage, a switching control signal, and a gate signal where noise occurs in a normal state.
Figure 9B:
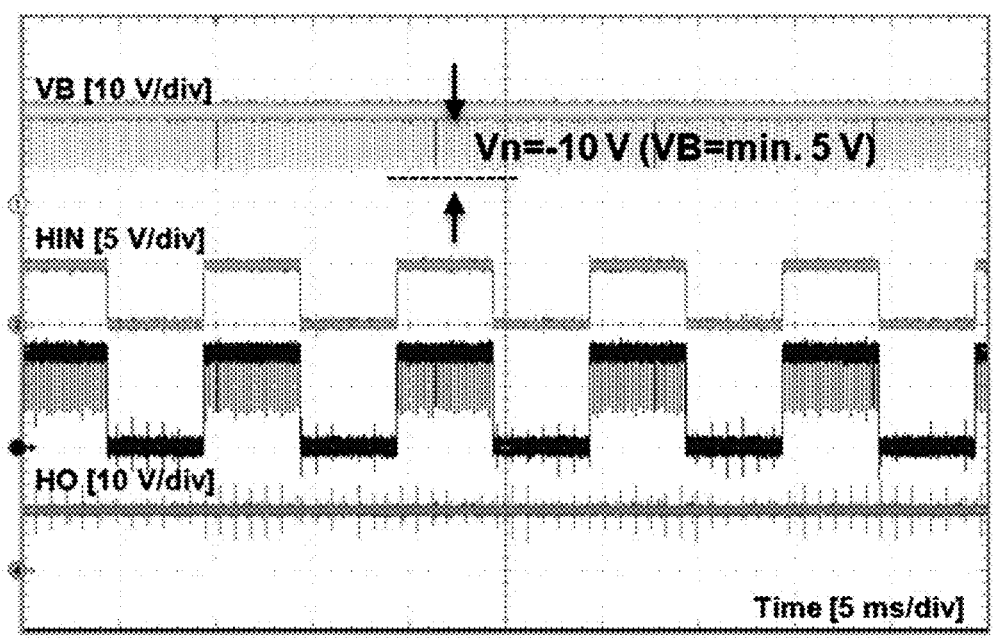

FIG. 9A and FIG. 9B show waveforms of a power supply voltage, a switching control signal, and a gate signal that experience noise in the normal state.

In FIG. 9A, a noise voltage Vn is 75V and the maximum power supply voltage VB is 90V.

In FIG. 9B, the noise voltage Vn is −10V and the minimum power supply voltage VB is 5V.

As shown in FIG. 9A and FIG. 9B, although the noise voltage Vn is a high-peak pulsating noise, the gate signal HO is output as high level or low level according to the switching control signal HIN. That is, the POR operation does not occur due to the noise voltage Vn, and the gate signal HO is normally generated according to the switching control signal HIN.

As described, the POR circuit according to the exemplary embodiments generates a signal for POR in an initial operation during which the power supply voltage is increased, and the POR circuit does not operate in the normal state. Thus, erroneous operation of the POR circuit due to pulsating noise of the power supply voltage can be prevented, and power consumption can be reduced.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A power-on reset (POR) circuit comprising:
    a capacitor in which a first current flows according to an increase of a power supply voltage;
    a current mirror configured to mirror the first current to a second current; and
    a transistor configured to be operated by the second current,
    wherein the power supply voltage reaches a normal reference voltage, and the POR circuit blocks mirroring of the current mirror and turns off the transistor.

2. The POR circuit of claim 1, wherein the current mirror comprises:
    a first current mirror configured to mirror the first current to a third current; and
    a second current mirror configured to mirror the third current to the second current.

3. The POR circuit of claim 2, wherein the first current mirror comprises:
    a first transistor including a source coupled to the power supply voltage, a drain, and a gate, the drain and the gate being diode-connected; and
    a second transistor including a gate coupled to the gate of the first transistor, a source coupled to the power supply voltage, and a drain coupled to the second current mirror, and
    the capacitor is coupled to the drain of the first transistor.

4. The POR circuit of claim 3, wherein the second current mirror comprises:
    a third transistor including a drain coupled to the drain of the second transistor and a gate coupled to the drain thereof; and
    a fourth transistor including a gate coupled to the gate of the third transistor and a drain coupled to a gate of the transistor.

5. The POR circuit of claim 1, comprising:
    a resistor coupled between the power supply voltage and the capacitor; and
    a first transistor including a gate coupled to a node where the resistor and the capacitor are coupled and a source coupled to the power supply voltage,
    wherein the current mirror is coupled to a drain of the first transistor.

6. The POR circuit of claim 5, wherein the current mirror comprises:
    a second transistor including a drain coupled to the drain of the first transistor and a gate coupled to the drain thereof; and
    a third transistor including a gate coupled to the gate of the second transistor and a drain coupled to a gate of the transistor.

7. The POR circuit of claim 1, further comprising:
    a first transistor configured to be turned on by a first voltage and blocking mirroring of the first current; and
    a second transistor configured to be turned on by a second voltage and turning off the transistor.

8. The POR circuit of claim 7, wherein the current mirror comprises two transistors configured to mirror a third current corresponding to the first current to the second current, and
    the first transistor is coupled between gates of the two transistors and a predetermined voltage and the first voltage is input to a gate of the first transistor.

9. The POR circuit of claim 7, wherein the second transistor comprises a gate to which the second voltage is input, a first terminal coupled to the power supply voltage, and a second terminal coupled to a gate of the transistor.

10. A method, comprising:
    mirroring a first current to a second current;
    charging a capacitor by the first current;
    coupling a first node with a power supply voltage to supply an output current to the first node in response to the second current; and
    decoupling the first node from the power supply voltage to stop supplying the output current in a normal state of the power supply voltage.

11. The method of claim 10, wherein the normal state begins after the power supply voltage reaches a predetermined voltage.

12. The method of claim 10, further comprising:
    receiving a comparison result of a sense voltage and a reference voltage at a second node, the sense voltage indicating the power supply voltage; and
    asserting a reset signal in response to the output current and the comparison result of the sense voltage and the reference voltage when the reference voltage is greater than the sense voltage.

13. The method of claim 10, further comprising activating a switching device in response to the second current to supply the output current to the first node.

14. The method of claim 10, wherein mirroring the first current to the second current includes:
    mirroring the first current to a third current; and
    mirroring the third current to the second current.

15. The method of claim 14, further comprising:
    activating a switching device to block mirroring the first current to the second current in response to a reference voltage.

16. The method of claim 10, further comprising:
    wherein the first current flows through a resistor coupled between the power supply voltage and the capacitor.

17. The method of claim 16, further comprising:
    activating a switching device to block mirroring the first current to the second current in response to a reference voltage.

18. A power-on reset (POR) circuit comprising:
    a capacitor into which a first current flows according to an increase of a power supply voltage;
    a current mirror configured to mirror the first current to a second current; and
    a transistor configured to supply an output current to a node in response to the second current,
    wherein the POR circuit stops supplying the output current in a normal state of the power supply voltage.

19. The POR circuit of claim 18, wherein the normal state begins after the power supply voltage reaches a predetermined voltage.

\* \* \* \* \*